United States Patent
McSwiney et al.

(10) Patent No.: US 7,071,125 B2
(45) Date of Patent: Jul. 4, 2006

(54) PRECURSORS FOR FILM FORMATION

(75) Inventors: Michael L. McSwiney, Scappoose, OR (US); Huey-Chiang Liou, Fremont, CA (US); Michael D. Goodner, Hillsboro, OR (US); Robert E. Leet, Scottsdale, AZ (US); Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/947,820

(22) Filed: Sep. 22, 2004

(65) Prior Publication Data

US 2006/0063394 A1   Mar. 23, 2006

(51) Int. Cl.
*H01L 21/31* (2006.01)
*H01L 21/469* (2006.01)
(52) U.S. Cl. .................... 438/783; 438/623; 521/61
(58) Field of Classification Search ............ 438/623, 438/624, 763, 780, 781, 783; 521/61, 63, 521/77, 184, 185, 189
See application file for complete search history.

(56) References Cited

U.S. PATENT DOCUMENTS

| | | | |
|---|---|---|---|
| 6,391,932 B1 * | 5/2002 | Gore et al. | 521/61 |
| 6,599,447 B1 * | 7/2003 | Stauf et al. | 252/520.21 |
| 2002/0173113 A1 * | 11/2002 | Todd | 438/398 |

* cited by examiner

*Primary Examiner*—Phuc T. Dang
(74) *Attorney, Agent, or Firm*—Blakely, Sokoloff, Taylor & Zafman LLP

(57) ABSTRACT

A method including introducing a precursor in the presence of a circuit substrate, and forming a film including a reaction product of the precursor on the substrate, wherein the precursor includes a molecule comprising a primary species of the film and a modifier. A method including introducing a precursor in the presence of a circuit substrate, the precursor including a primary species and a film modifier as a single source, and forming a film on the circuit substrate. An apparatus including a semiconductor substrate, and a film on a surface of the semiconductor substrate, the film including a reaction product of a precursor including a molecule comprising a primary species and a modifier.

23 Claims, 5 Drawing Sheets

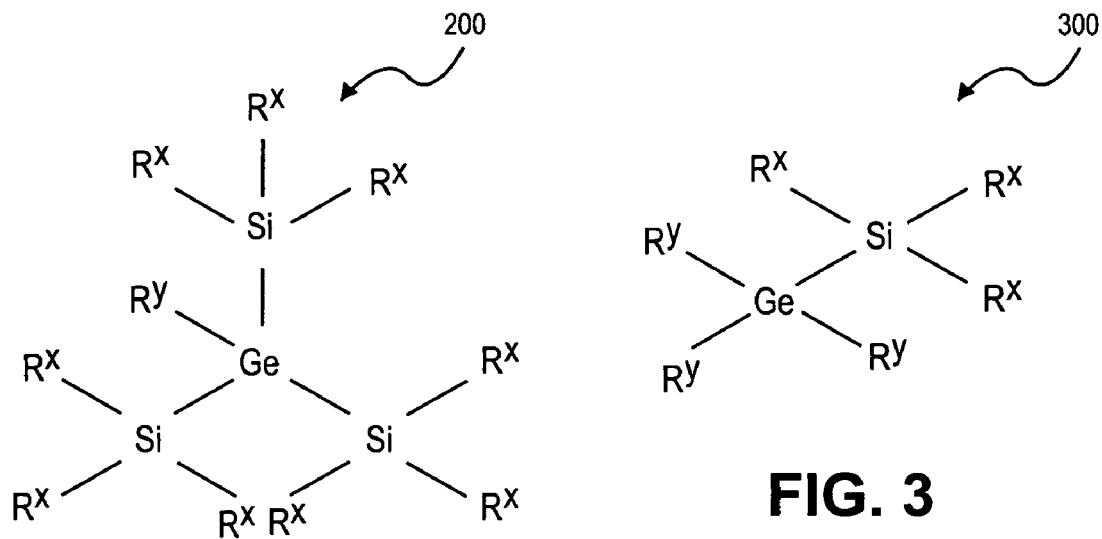
FIG. 2
FIG. 3
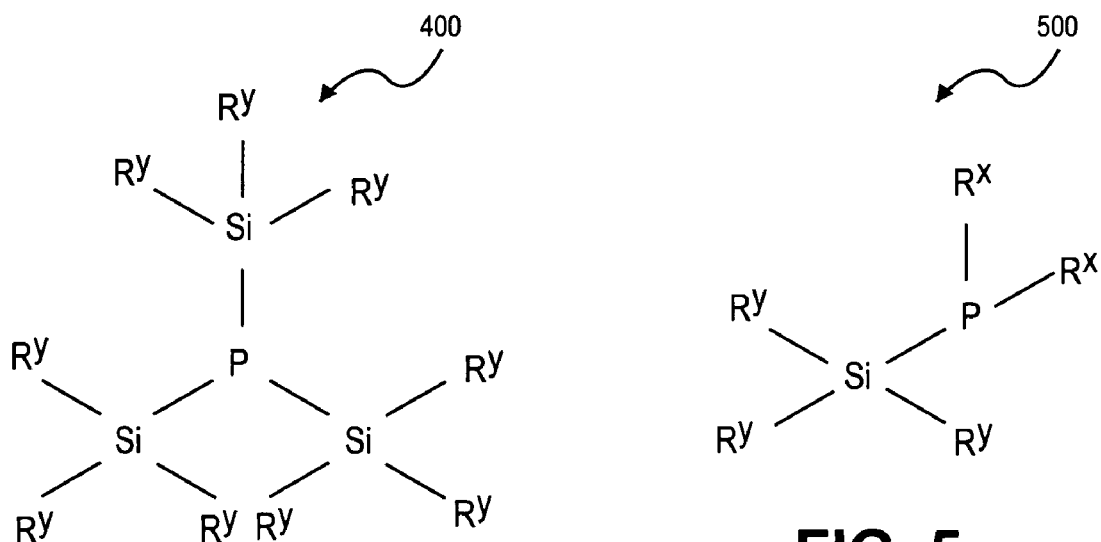
FIG. 4
FIG. 5

US 7,071,125 B2

PRECURSORS FOR FILM FORMATION

BACKGROUND

1. Field

Circuit processing.

2. Background

Advanced circuit structures demand precision in the processing techniques that are used to form them. Advanced transistor structures, for example, require precisely doped semiconductor (e.g., silicon) layers that may serve, for example, as source/drain regions, tips, and channels. As device (e.g., transistor) geometries shrink, these layers become thinner and the composition of the layer must increasingly be more carefully controlled. Ion implantation remains one of the leading techniques to dope silicon, but as layers becomes thinner, ion implantation lacks the precision to dope some of the more delicate structures. In terms of depositing semiconductor layers, epitaxial deposition is often used. Doping of epitaxial layers may be accomplished by ion implantation or by separately introducing a semiconductor precursor and a doping precursor in the formation of the epitaxial layer.

In addition to electrically active layers such as described above, integrated circuits use dielectric layers to isolate individual devices on a chip. These dielectric materials include materials such as silicon dioxide ($SiO_2$), phosphosilicate glass (PSG), silicon carbide (SiC), fluorinated silicate glass (FSG), and carbon doped oxide (CDO). A dielectric material is selected in one regard for its dielectric properties as well as its parasitic capacitance. As the parasitic capacitance is reduced, the cross-talk (e.g., a characterization of the electric field between adjacent interconnections) is reduced, as is the resistance-capacitance (RC) time delay and power consumption (e.g., with respect to signals conducted along interconnections). The property of a dielectric material, notably its dielectric constant, may be altered by dopants or changes in porosity. Thus, the ability to precisely control a dopant concentration and/or porosity within a layer becomes critical as circuit performance is maximized for semiconductor and dielectric materials.

BRIEF DESCRIPTION OF THE DRAWINGS

Features, aspects, and advantages of embodiments will become more thoroughly apparent from the following detailed description, appended claims, and accompanying drawings in which:

FIG. 2 shows one example of a silicon-germanium precursor in the form of a germanium hydride.

FIG. 3 shows another example of a silicon-germanium precursor in the form of a germyl silane.

FIG. 4 shows one example of a silicon-phosphorous precursor in the form of a phosphine.

FIG. 5 shows another example of a silicon-phosphorous precursor in the form of a phosphine.

DETAILED DESCRIPTION

In one embodiment, a method is described. The method relates to forming a film or films on a circuit substrate, such as a semiconductor substrate. Suitable films include, but are not limited to, active layer films that may contain one or more components of a device (e.g., source/drain, tips, channels, etc.) and dielectric films such as might be used between the substrate and various interconnection metal layers formed on the substrate.

Figure 1:
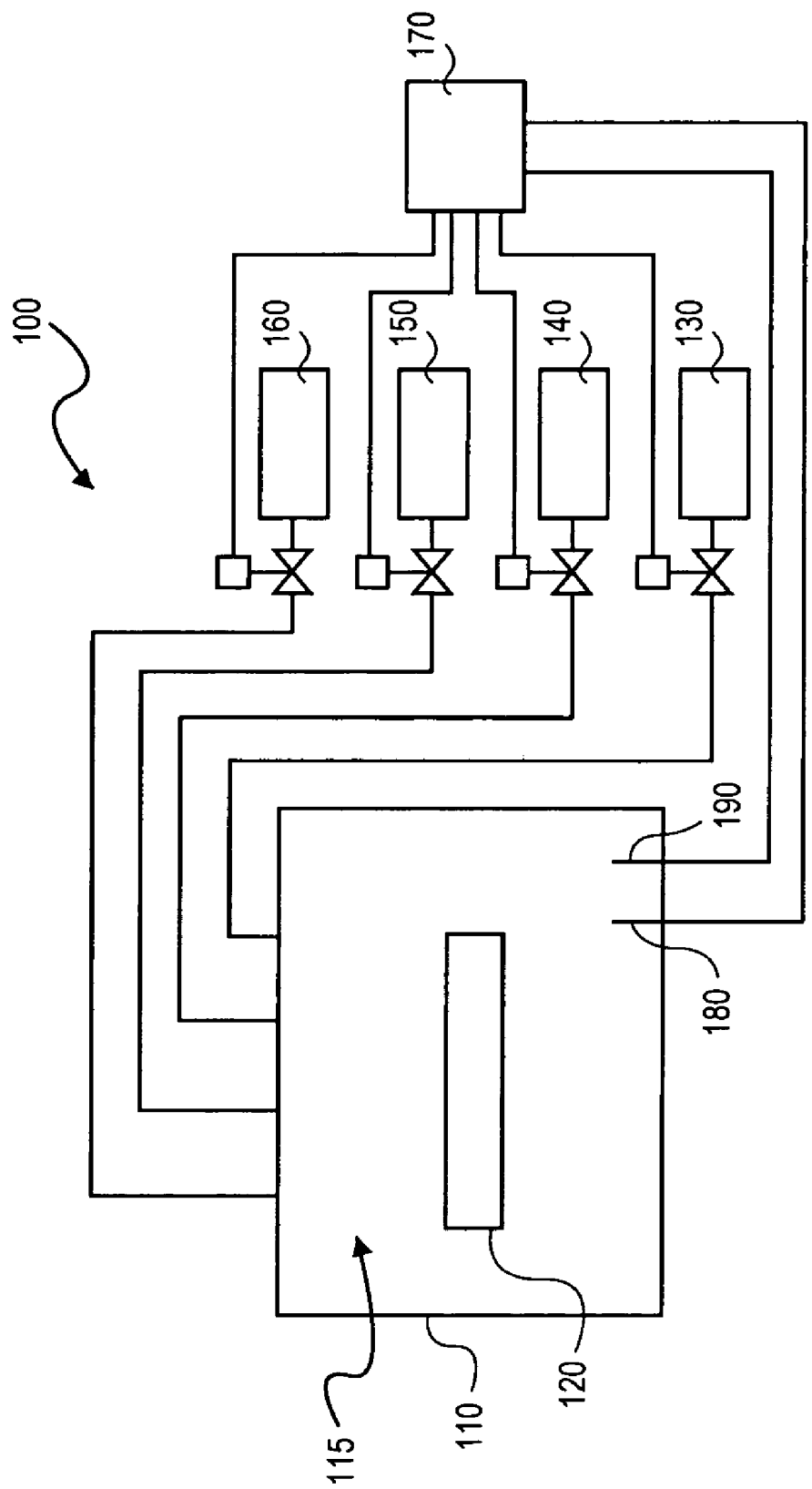
FIG. 1 shows a schematic side view of a system for depositing film.

FIG. 1 shows a system that may be suitable for depositing a film. System 100 may be utilized with any of various deposition techniques including, but not limited to, a system employing deposition through a vertical diffusion furnace (VDF), a chemical vapor deposition (CVD) technique, a plasma enhanced CVD (PECVD, including remote plasma) technique, an atomic layer deposition (ALD) technique, and an electrospray deposition technique. System 100 includes chamber 110 that has volume 115 of a size suitable to contain a substrate, such as a 200 millimeter (mm) or 300 mm wafer. FIG. 1 shows wafer 120 within volume 115 in chamber 110. In other embodiments, chamber 110 may have volume 115 to contain several wafers.

Referring to FIG. 1, chamber 110 is of a material suitable for the desired deposition technique. Connected to chamber 110 are various sources. Included among the sources are inert gas source 130, such as a nitrogen gas source. Additional sources are selected for a particular deposition. In one embodiment, source 140 contains a precursor including a primary species of the film to be formed and a modifier. System 100 may also include first supplemental source 150 and second supplemental source 160. First supplemental source 150 is, for example, a source containing the primary species of the film to be formed on substrate 120. Second supplemental source 160 contains, for example, a modifier for the film to be formed on substrate 120. A modifier includes in this context, a dopant or a porogen. Each of the sources (e.g., inert gas source 130, precursor source 140, first supplemental source 150, and second supplemental source 160) is contained in a suitable tank. Connected to each tank is a release valve. Each release valve is connected to processor 170. In one embodiment, processor 170 includes machine readable program instructions to execute a method to open a release valve and release a source gas into volume 115 of chamber 110.

Although illustrated as a single tank source (e.g., gas source), suitable combination precursors may be delivered to a chamber (e.g., chamber 110 of FIG. 1) according to various techniques. Representatively, the combination precursor may be in various forms and delivered via vapor draw, direct liquid injection, or bubbling. The combination precursor can be delivered to the reaction chamber separately or as a pre-mixed precursor cocktail. In the embodiment where a primary species of the film is silicon, for example, the combination precursor can be delivered to a reaction chamber (e.g., chamber 110 of FIG. 1) separately or as a pre-mixed precursor cocktail consisting of a silicon-modifier precursor (precursor source 140), a silicon source (e.g., supplemental source 150), a modifier source (e.g., supplemental source 160), and/or an appropriate solvent (which can be any appropriate organic solvent, including, but not limited to, hexanes, octanes, and nonanes). In another embodiment, the combination precursor may be introduced alone or with one of the noted other sources.

FIG. 1 also shows pressure gauge 180 connected to processor 170. Pressure gauge 180 is, for example, a BARATROM™ pressure sensor capable of monitoring a pressure within volume 115 and relaying a signal representative of the pressure in volume 115 to processor 170. System 100 also includes temperature sensor 190 within volume 115 of chamber 110. Temperature sensor 190 is capable of measuring a temperature within volume 115 of chamber 110 and sending a signal representative of that temperature to processor 170. It is appreciated that a suitable chamber may contain multiple pressure and temperature sensors. Processor 170 includes machine readable program instructions to monitor and establish a pressure and temperature necessary for a particular film formation process within chamber 110.

In one embodiment, a precursor is delivered to chamber 110 that includes a primary species of a film to be formed and a modifier (a "combination precursor"). The primary species and the modifier are introduced through a single source such as precursor source 140 in system 100 of FIG. 1. The primary species and the modifier may be part of a single molecule.

In terms of active layer film formation, one type of combination precursor that may be delivered to volume 115 of chamber 110 in FIG. 1 is a silicon-germanium precursor. FIG. 2 shows an example of a silicon-germanium precursor as a single molecule. Precursor 200 has the general formula:

$$GeR^y(SiR^x{}_3)_3$$

where $R^x$ and $R^y$ are selected from a hydrogen, an amine, a halogen, an alkyl, an aryl, a silyl, a substituted form of the noted groups or other organic ligand containing, in one embodiment, from one to 20 carbons. Each $R^x$ and $R^y$ may be the same or different (e.g., independent). One example of a silicon-germanium precursor source as a single molecule as precursor 200 is tris(trimethylsilyl)germanium hydride, where $R^y$ is a hydrogen and each $R^x$ is an alkyl (a methyl group).

A second type of silicon-germanium precursor is shown in FIG. 3. Precursor 300 has the general formula:

$$SiR^x{}_3(GeR^y{}_3)$$

where $R^x$ and $R^y$ may be selected from a hydrogen, an amine, a halogen, an alkyl, an aryl, a silyl, a substituted form of the noted groups or other organic ligand containing, in one embodiment, from one to 20 carbons. Each R may be the same or different (e.g., independent). One example of a silicon-germanium precursor as precursor 300 is trimethyl (trimethylgermyl)silane, where each $R^x$ and each $R^y$ is an alkyl (a methyl group).

Another type of modifier to be combined with a primary species in the form of a precursor for forming a film is a dopant. Representatively, P- and N-type dopants are used to modify a semiconductor such as silicon in the formation of active films. A typical dopant for a P-type semiconductor substrate is boron. Typical dopants for an N-type semiconductor material are arsenic or phosphorous. In one embodiment, a combination precursor includes a molecule including a primary species of the film (e.g., silicon) and a dopant. FIG. 4 shows one example of a silicon phosphorous precursor. In this embodiment, the precursor as a single molecule has the general formula:

$$R^x{}_zJSiR^y{}_3$$

where $R^x$ and $R^y$ may be the same or different (e.g., independent) and may be selected from a hydrogen, an amine, a halogen, an alkyl, an aryl, a silyl, a substituted form of the noted groups or other organic ligand containing, in one embodiment, from one to 20 carbons. In this example, x+z=3, and $R_x$ may also be nothing at all (i.e., z=3). J may be phosphorous and boron. One example of this precursor is precursor 400 where x is zero and J is phosphorous. An example of this type is tris(trimethylsilyl)phosphine, where each $R^y$ is an alkyl (a methyl group).

FIG. 5 shows a second example of a molecule including a primary species (e.g., silicon) of a film and a dopant of phosphorous. Precursor 500 is a dimethyl(trimethylsilyl) phosphine. In this embodiment, the precursor again is a single molecule having the general formula:

$$SiR^y{}_3(JR^x{}_2).$$

where each $R^x$ and $R^y$ is an alkyl (a methyl group) and J is phosphorous.

The above embodiments describe forming active films (e.g., layers) using a combination precursor. The combination precursor technique may also be used in the formation of dielectric layers. In one embodiment, it is desired to deposit precursors (e.g., dielectric film precursors) at a relatively low temperature, such as less than 500° C. In certain instances, it is also desirous to form films having dielectric constants less than silicon dioxide ($SiO_2$) (low k dielectrics). One way low k dielectrics may be formed is by doping an $SiO_2$ film. Another technique is to form porous films.

Figure 6:
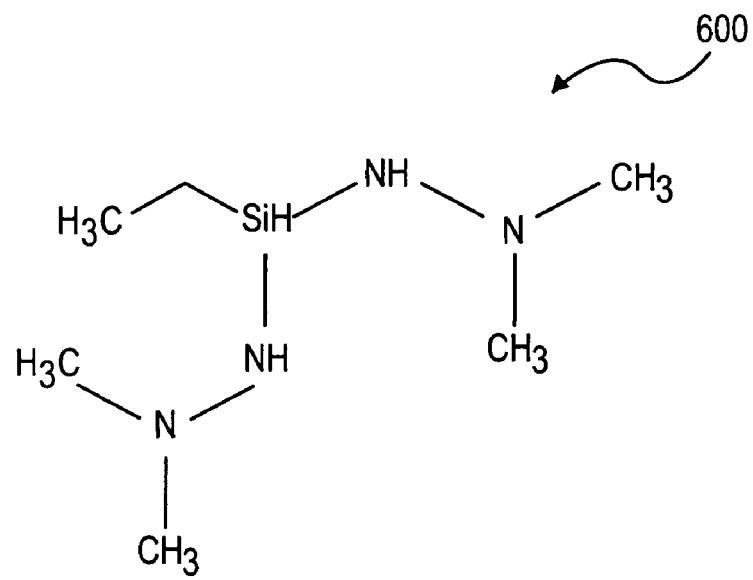
FIG. 6 shows an example of a dielectric precursor in the form of a silane substituted with hydrazine moeties.
Figure 7:
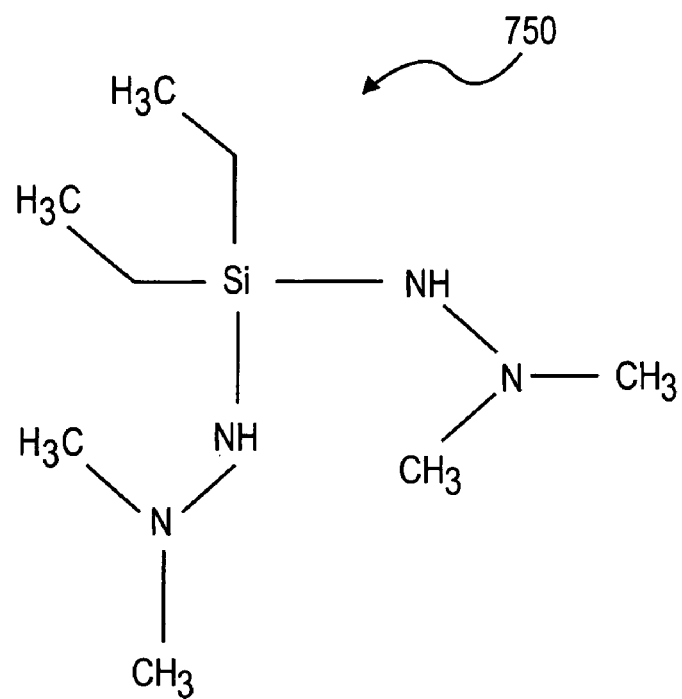
FIG. 7 shows another example of a dielectric precursor in the form of a silane substituted with hydrazine moeties.

FIG. 6 and FIG. 7 show examples of combination precursors as single molecules that may be utilized to form a dielectric film. FIG. 6 and FIG. 7 show examples of substituted hydrazine moieties. A silane substituted with hydrazine moieties may have the general formula:

$$Si(N_2R_2)_xR_y$$

where R is a ligand including, but not limited to, hydrogen, alkyl, aryl, or amine and each R may be the same or different (e.g., independent). The silane substituted with hydrazine moieties may be introduced at a temperature (e.g., a temperature within volume 115 of chamber 110) in the presence of oxygen. The combination precursor reacts with oxygen to form an oxide film. Molecule 600 of FIG. 6 is bis (2,2-dimethyl-hydrazino) ethylsilane and molecule 700 of FIG. 7 is bis (2,2-dimethyl-hydrazino) diethylsilane. Although illustrated as an alkyl (e.g., methyl), the R groups may be independent and selected from H, other alkyls, aryls, amines, etc.

A second group of precursor compounds for a dielectric film is shown in FIGS. 8–12. These compounds consist of cyclic silazanes (e.g., four or six membered rings with alternating silicon and nitrogen atoms). In one embodiment, cyclic silazanes are represented by the following formulas:

$$Si_2N_2R_6 \quad Si_3N_3R_9$$

where R in each molecule is a ligand including, but not limited to, hydrogen, alkyl, aryl, or amine and the different R groups in each molecule may be the same or different (e.g., independent).

Figure 8:
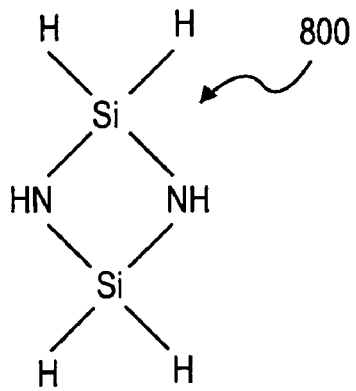
FIG. 8 shows one example of a dielectric material precursor in the form of a cyclic silazane.
Figure 9:
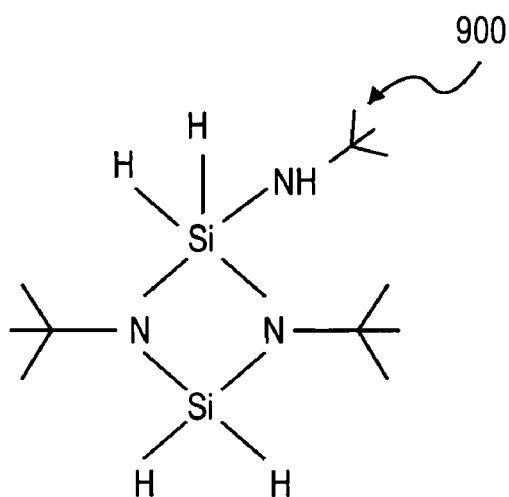
FIG. 9 shows another example of a dielectric material precursor in the form of a cyclic silazane.
Figure 10:
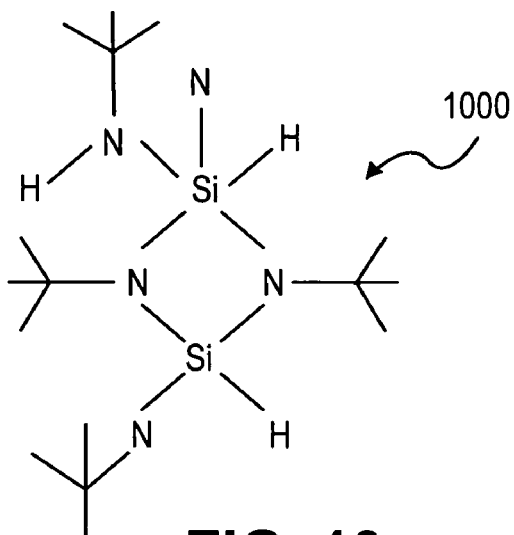
FIG. 10 shows another example of a dielectric material precursor in the form of a cyclic silazane.
Figure 11:
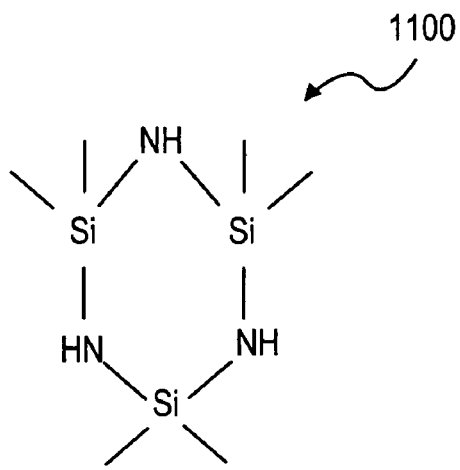
FIG. 11 shows another example of a dielectric material precursor in the form of a cyclic silazane.
Figure 12:
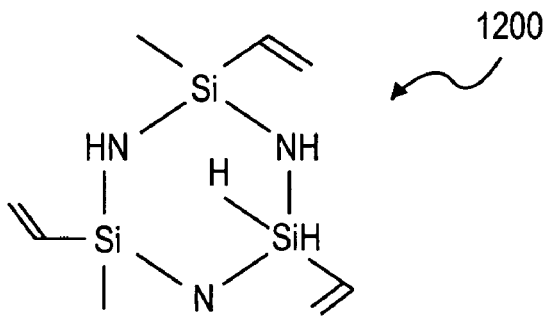
FIG. 12 shows another example of a dielectric material precursor in the form of a cyclic silazane.

FIG. 8 shows precursor molecule 800 that is cyclodisilizane. FIG. 9 shows precursor molecule 900 that is 1-tertiarybutylamino-2,4-ditertiarybutylcyclodisilazane, FIG. 10 shows precursor molecule 1000 that is 1,3-ditertiarybutylamino-2,4-ditertiarybutyl-cyclodisilazane. FIG. 11 shows precursor molecule 1100 that is 2,2,4,4,6,6-hexamethylcyclotrisilazane. FIG. 12 shows precursor molecule 1200 that is 2,4,6-trimethyl-2,4,6-trivinyl-cyclotrisilazane.

Figure 13:
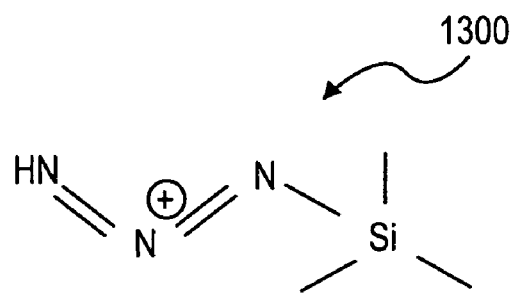
FIG. 13 shows one example of a dielectric material precursor in the form of an azidosilane.

Another family of precursor compounds that may be suitable to form a dielectric film include azidosilanes. A molecular feature of this family of compounds includes at least one azide ligand (N$_3$) bound to silicon (e.g., a silane, disilane, or some other variation such as noted in the previous chemical families). FIG. 13 shows one example of an azidosilane. Molecule 1300 is trimethylazidosilane. Other alkyls or other noted R groups may be substituted for the methyl groups and may be the same or different.

Figure 14:
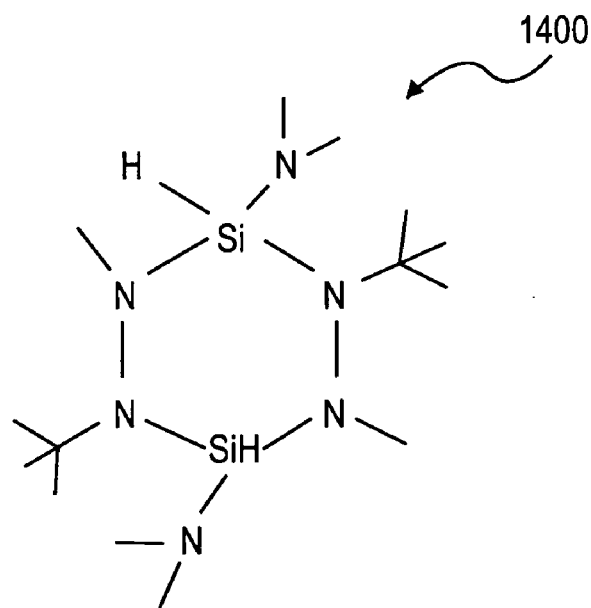
FIG. 14 shows one example of a dielectric material precursor in the form of a tetraazadisilacyclohexane.
Figure 15:
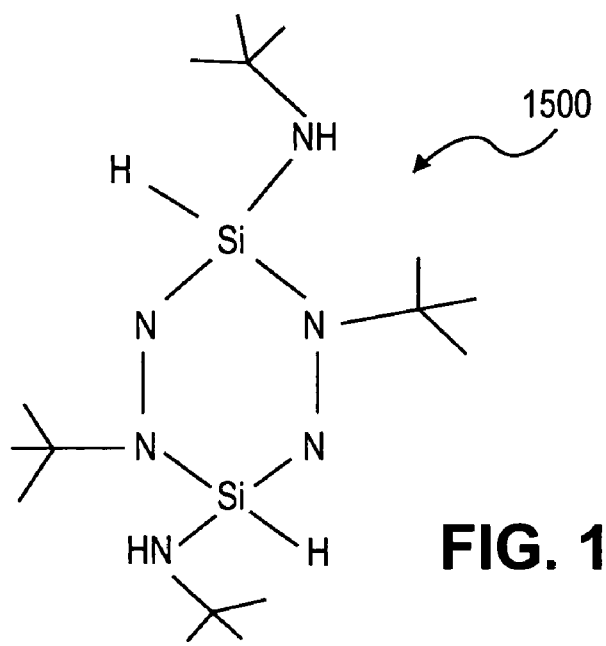
FIG. 15 shows another example of a dielectric material precursor in the form of a tetraazadisilacyclohexane.

Another family of compounds suitable as precursors for forming a dielectric film include precursor molecules based on 1,2,4,5-tetraaza-3,6-disilacyclohexane, a six membered ring containing two silicon and four nitrogen atoms with the general formula:

where R is a ligand, including, but not limited to, hydrogen, an alkyl, an aryl, and an amine and each R may be similar or different (e.g., independent). FIG. 14 and FIG. 15 illustrate two examples of precursor molecules. FIG. 14 shows molecule 1400 of a 3,6-bis (dimethylamino)-1,4-ditertiarybutyl-2,5-dimethyl-1,2,4,5-tetraaza-3,6-disilacyclohexane. FIG. 15 shows precursor molecule 1500 of 3,6-bis (tertiarybutylamino)-1,4-ditertiarybutyl-1,2,4,5-tetraaza-3,6-disilacyclohexane.

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. A method comprising:
introducing a precursor in the presence of a circuit substrate; and
forming a film comprising a reaction product of the precursor on the substrate,
wherein the precursor comprises a molecule comprising a primary semiconductor species of the film and a modifier selected to form, in combination with the primary species, one of a germanium film and a dielectric film.

2. The method of claim 1, wherein the primary species comprises silicon.

3. The method of claim 2, wherein the precursor is a first reactant species, the method further comprising:
introducing a second reactant species.

4. The method of claim 3, wherein the second reactant species comprises one of a silicon-containing molecule and a dopant containing molecule, and the amount of the second reactant species is selected to target a dopant concentration in the film.

5. The method of claim 3, wherein the second reactant species comprises one of a silicon containing molecule and a dopant containing molecule, the method further comprising introducing a third reactant species that comprises the other of the silicon containing molecule and the dopant containing molecule.

6. The method of claim 2, wherein the modifer comprises germanium.

7. The method of claim 2, wherein the film comprises a dielectric material.

8. The method of claim 7, wherein the dopant comprises carbon.

9. The method of claim 7, wherein the precursor is reactive at a temperature less than 500° C.

10. The method of claim 1, wherein the modifier comprises a porogen.

11. A method comprising:
introducing a precursor in the presence of a circuit substrate, the precursor comprising a primary species and a film modifier as a single source, the film modifier selected to form, in combination with the primary species, one of a germanium film and a dielectric film; and
forming a film on the circuit substrate.

12. The method of claim 11, wherein the modifier comprises germanium.

13. The method of claim 11, wherein the film comprises a dielectric material.

14. The method of claim 13, wherein the film modifier comprises carbon.

15. The method of claim 13, wherein the precursor is reactive at a temperature less than 500° C.

16. The method of claim 11, wherein the film modifier comprises a porogen.

17. The method of claim 11, when forming a film comprises forming an epitaxial layer on a surface of a semiconductor.

18. An apparatus comprising:
a semiconductor substrate; and
a film on a surface of the semiconductor substrate, the film comprising a reaction product of a precursor comprising a molecule comprising a primary species and a modifier selected to form, in combination with the primary species, one of a germanium film and a dielectric film.

19. The apparatus of claim 18, wherein the primary species comprises silicon and the modifier comprises germanium.

20. The apparatus of claim 18, wherein the film comprises a dielectric material.

21. The apparatus of claim 20, wherein the modifier comprises carbon.

22. The apparatus of claim 18, wherein the modifier comprises a porogen.

23. The apparatus of claim 18, wherein the film comprises an epitaxial layer.

* * * * *